United States Patent
Saito et al.

(10) Patent No.: US 8,945,690 B2
(45) Date of Patent: Feb. 3, 2015

(54) METHOD AND APPARATUS FOR MASS-PRODUCING DLC FILMS

(75) Inventors: Takao Saito, Nagoya (JP); Masashi Hayakawa, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 1293 days.

(21) Appl. No.: 12/385,062

(22) Filed: Mar. 30, 2009

(65) Prior Publication Data

US 2009/0246409 A1    Oct. 1, 2009

(30) Foreign Application Priority Data

Mar. 31, 2008  (JP) ................................. 2008-091400
Mar. 10, 2009  (JP) ................................. 2009-057109

(51) Int. Cl.
| | |
|---|---|
| C23C 16/503 | (2006.01) |
| C23C 16/515 | (2006.01) |
| C23C 16/26  | (2006.01) |
| C23C 16/458 | (2006.01) |
| H03K 3/57   | (2006.01) |

(52) U.S. Cl.
CPC ............... *C23C 16/515* (2013.01); *C23C 16/26* (2013.01); *C23C 16/4587* (2013.01); *C23C 16/503* (2013.01); *H03K 3/57* (2013.01)
USPC ........................................................ 427/577

(58) Field of Classification Search
CPC .... C23C 16/26; C23C 16/503; C23C 16/515; C23C 16/4587
USPC ...................................................... 427/577
See application file for complete search history.

(56) References Cited

U.S. PATENT DOCUMENTS 7,109,069 B2 *    9/2006    Kokubo et al. ............... 438/149
2005/0218423 A1   10/2005   Shimizu et al.

FOREIGN PATENT DOCUMENTS

| DE | 10 2004 004 177 B4 | 3/2006 |
| EP | 1 598 442 A1       | 11/2005 |
| JP | A-9-87847          | 3/1997 |
| JP | A-2000-231213      | 8/2000 |
| JP | A-2002-321026      | 11/2002 |
| JP | A-2004-263292      | 9/2004 |
| JP | A-2005-320584      | 11/2005 |
| JP | B2-3811681         | 8/2006 |

OTHER PUBLICATIONS

NPL-1: Prelas et al, Handbook of industrial diamond and diamond like films, p. 69, 1997.*

(Continued)

*Primary Examiner* — Jie Yang
(74) *Attorney, Agent, or Firm* — Oliff PLC (57) ABSTRACT

A DLC film mass-producing apparatus 10 includes a chamber 12 connected to ground. In the chamber 12, a plurality of plate-shaped substrates 60 are disposed in parallel at regular intervals, without disposing a counter electrode that faces each of the plate-shaped substrates 60. Sputtering cleaning is then conducted by plasma discharge and an underlying contact layer is formed on each of the plate-shaped substrates 60. Subsequently, a DLC film is produced on each of the plate-shaped substrates 60 by injecting a carbon source gas into the chamber 12 such that the internal pressure of the chamber 12 reaches 0.1 to 10 Pa and applying a negative DC pulse voltage having a pulse half width of 0.1 to 3 μsec to each of the plate-shaped substrates 60 to generate plasma.

9 Claims, 5 Drawing Sheets (56) References Cited

OTHER PUBLICATIONS

Qi S. et al., "Effect of Pulse Waveform on Plasma Sheath Expansion in Plasma-based Ion Implantation," Nuclear Instruments & Methods in Physics Research, Section—B:Beam Interactions With Materials and Atoms, Elsevier, Amsterdam, NL, vol. 170, No. 3-4, Oct. 1, 2000, pp. 397-405.

Cluggish B. P. et al., "Sheath Overlap During Very Large Scale Plasma Source Ion Implantation," Journal of Applied Physics, American Institute of Physics, New York, US, vol. 84, No. 11, Dec. 1, 1998, pp. 5937-5944.

European Search Report for European Patent Application No. 09250926.4, dated Aug. 6, 2009.

Mar. 27, 2012 Office Action issued in Japanese Patent Application No. 2009-057109 (with translation).

\* cited by examiner

METHOD AND APPARATUS FOR MASS-PRODUCING DLC FILMS

BACKGROUND OF THE INVENTION

1. Technical Field

The present invention relates to a method for mass-producing DLC films and an apparatus for mass-producing DLC films, and more specifically to a method and an apparatus for mass-producing DLC films on a plurality of plate-shaped substrates. DLC stands for diamond-like carbon.

2. Description of the Related Art

A DLC film, whose crystal structure is amorphous, is a material used in various technical fields because a DLC film has not only high hardness but also excellent mechanical properties such as wear resistance and low friction. Plasma CVD is known as a method for producing such a DLC film on a substrate. In this method, a DLC film is produced on a substrate by disposing a placement electrode on which the substrate is placed and a counter electrode facing the substrate in a chamber such that they have a certain interval and by applying a negative pulse voltage to the counter electrode in a carbon source gas atmosphere to generate plasma. DLC films can be produced on a plurality of substrates by this method. In this case, however, the counter electrode is required for each of the substrates, which results in upsizing of an apparatus.

In contrast, Patent Document 1 discloses a method for producing DLC films on a plurality of substrates without disposing counter electrodes. In this method, DLC films are produced on a plurality of plate-shaped substrates by holding the plurality of plate-shaped substrates stacked in a vertical direction in a chamber connected to ground such that the interval between the adjacent plate-shaped substrates in parallel and in a vertical direction is in a range of 2 to 30 mm, setting the internal pressure of the chamber in a range of 13 to 1330 Pa, injecting a carbon source gas from a plurality of nozzles to the chamber, and applying a negative voltage to each of the plate-shaped substrates to generate plasma. This method does not require a counter electrode, and thus an apparatus can be downsized. Furthermore, a sheath width can be narrowed by setting the internal pressure of the chamber in a range of 13 to 1330 Pa, and the interval between the plate-shaped substrates can be narrowed in accordance with the sheath width, and thus an apparatus can be further downsized Patent Document 1: JP 2004-263292 A

SUMMARY OF THE INVENTION

In the method for producing DLC films on a plurality of plate-shaped substrates by plasma CVD without disposing a counter electrode, the sheath width tends to broaden in proportion to the application time of a negative voltage. Therefore, the sheath width can be narrowed by shortening the application time of a negative voltage. Specifically, a DC pulse source is used to apply a negative voltage, and the sheath width is narrowed by making the pulse half width shorter. As a result, the interval between the plate-shaped substrates can be narrowed in accordance with the sheath width, allowing downsize of an apparatus.

However, when a DC pulse source is used in such a method, a DLC film is sometimes not produced due to the internal pressure of a chamber. That is to say, the interval between the plate-shaped substrates can be narrowed because the sheath width tends to become narrow when the internal pressure of the chamber is set to be several tens of pascals, but a film having insufficient hardness and low friction is produced. Such a film can be called an amorphous carbon film, but not a DLC film due to lack of hardness, wear resistance, and low friction generally required for DLC films.

In view of the foregoing problems, a main object of the present invention is to provide a method and an apparatus for mass-producing DLC films with good characteristics on a plurality of plate-shaped substrates using a small apparatus.

In the present invention, the following measure is adopted to achieve the main object described above.

The present invention provides a DLC films mass-producing method for mass-producing DLC films on a plurality of plate-shaped substrates, including the steps of: (a) disposing the plurality of plate-shaped substrates in parallel at regular intervals, without disposing a counter electrode that faces each of the plate-shaped substrates in a chamber connected to ground; and (b) injecting a carbon source gas into the chamber such that an internal pressure of the chamber reaches 0.1 to 10 Pa and applying a negative DC pulse voltage having a pulse half width of 0.1 to 3 μsec to each of the plate-shaped substrates to generate plasma, so as to produce a DLC film on each of the plate-shaped substrates.

In this DLC films mass-producing method, since a counter electrode facing each of the plate-shaped substrates is not necessarily disposed, a DLC film mass-producing apparatus can be downsized compared with a case where a counter electrode corresponding to each of the plate-shaped substrates is disposed. A region with a low electron density called a sheath is formed around each of the plate-shaped substrates when plasma is generated. Because an overlap of sheathes of the plate-shaped substrates adjacent to each other interferes with film formation, the interval between the plate-shaped substrates is set such that sheaths do not overlap with each other. Therefore, the interval between the plate-shaped substrates can be narrowed as the sheath width becomes narrow. In terms of plasma generating conditions, the sheath width tends to become narrow as the pulse half width of a DC pulse decreases at a constant internal pressure. The sheath width also tends to become narrow as the internal pressure increases at a constant pulse half width of a DC pulse. However, it was found from an experiment that, in a case where a DLC film is produced using a DC pulse, too high an internal pressure results in a film having insufficient hardness and surface roughness, that is, an amorphous carbon film that cannot be called a DLC film. On the basis of this experiment result, the internal pressure of the chamber was set to be 0.1 to 10 Pa, and the pulse half width of a DC pulse when applying a negative voltage was set to be 0.1 to 3 μsec. With this arrangement, sheath width in plasma generation can be sufficiently narrow and a DLC film having high hardness and low surface roughness can be produced. Furthermore, since the pulse half width is short, increase of the temperature of the substrates can be prevented and films can be formed on a material having a low melting point, such as a resin material. For example, sheath width can be controlled to about 5 mm when the internal pressure of the chamber and the pulse half width are set to be 10 Pa and 2.5 μsec, respectively. Accordingly, DLC films having good characteristics can be produced on a plurality of plate-shaped substrates using a small apparatus, by the method for mass-producing DLC films according to the present invention.

In the present invention, the pulse half width means a time interval at half the height of the peak pulse voltage. The range of the pulse half width is 0.1 to 3 μsec, preferably 0.5 to 1.5 μsec. Among amorphous carbons, a DLC film is particularly defined as a metastable hard amorphous carbon that has a random structure containing a large amount of $sp^3$ hybridized carbon atoms (Handbook of diamond-like carbon films; Hidetoshi Saito Ed.; NFS Inc.). However, there is still no established definition of its characteristics. Since a DLC film needs to have high hardness, wear resistance, and low friction, a DLC film preferably has such properties.

In the step (b) of the DLC films mass-producing method according to the present invention, the internal pressure of the chamber may be set in a range of 0.1 to 10 Pa while the pulse half width may be set in a range of 0.1 to 3 μsec so that a sheath width determined according to the internal pressure of the chamber and the pulse half width is controlled to 5 mm or more and 40 mm or less. As a result, the interval between the plate-shaped substrates adjacent to each other can be sufficiently narrowed, and a mass-producing apparatus can be sufficiently downsized. Furthermore, gas diffusion occurs fast at the vacuum of 10 Pa or less and gas is distributed uniformly in the chamber, a gas inlet can be provided on the side surface of the chamber. This arrangement contributes to simplification of the apparatus structure.

In the step (b) of the method for mass-producing DLC films according to the present invention, the interval between the plate-shaped substrates adjacent to each other may be set to be more than twice the sheath width determined according to the internal pressure of the chamber and the pulse half width. As a result, an overlap of sheathes of the plate-shaped substrates adjacent to each other can be prevented and a film can be formed on an entire surface of each of the plate-shaped substrates.

In the method for mass-producing DLC films according to the present invention, a calibration curve that describes a relationship between the sheath width, the internal pressure of the chamber, and the pulse half width may be prepared in advance; and the internal pressure of the chamber and the pulse half width may be set according to the calibration curve so that a desired sheath width is achieved. This is because the sheath width varies according to the internal pressure of the chamber and the pulse half width.

In the DLC films mass-producing method according to the present invention, the plate-shaped substrates may be made of an iron material. An SUS material, an SS material (rolled steel for general structure), an SKD material (die steel), or an SKH material (high-speed steel) is preferred as the iron material. Examples of the SUS material include iron-chromium-nickel SUS304 and SUS316, iron-chromium SUS410 and SUS430, and SUS440. Examples of the SS material include SS400. Examples of the SKD material include SKD11 and SKD61. Examples of the SKH material include SKH2, SKH10, SKH51, and SKH55. Obviously, this method may use a substrate made of a material mainly composed of aluminum or a substrate made of a material mainly composed of copper. Furthermore, each surface of the plate-shaped substrates may be coated with a wear-resistant layer. Examples of the wear-resistant layer include Cr plating, Ni plating, a TiC layer, and a WC layer. The plate-shaped substrates may otherwise be made of metal with resin material provided thereon. Examples of the resin material includes polyethylene resin, polycarbonate resin, acrylic resin, vinyl chloride resin, and nylon resin. Property of the metal on which the resin material is provided is not particularly limited, but preferably is iron material or aluminum material.

In the DLC film mass-producing method according to the present invention, in the step (b), a device having an inductor, a first semiconductor switch, and a second semiconductor switch that are connected in series between both terminals of a DC power supply unit may be used as a generator of the DC pulse voltage, the inductor having a terminal connected to an anode terminal of the first semiconductor switch and another terminal connected to a gate terminal of the first semiconductor switch through a diode, the diode having an anode terminal connected to the gate terminal of the first semiconductor switch; inductive energy is stored in the inductor with an electrical connection of the first semiconductor switch that occurs when the second semiconductor switch is turned on; and a pulse voltage is generated in the inductor with a turn-off of the first semiconductor switch that occurs when the second semiconductor switch is turned off, and the pulse voltage is raised and supplied to a coil element magnetically connected to the inductor.

The present invention also provides a DLC film mass-producing apparatus in which each step of the DLC film mass-producing method described above is realized.

BRIEF DESCRIPTION OF THE DRAWINGS

FIG. 1 is an explanatory view schematically showing a DLC film mass-producing apparatus 10 of Example 1 or the like;

BEST MODE FOR CARRYING OUT THE INVENTION

Figure 1:
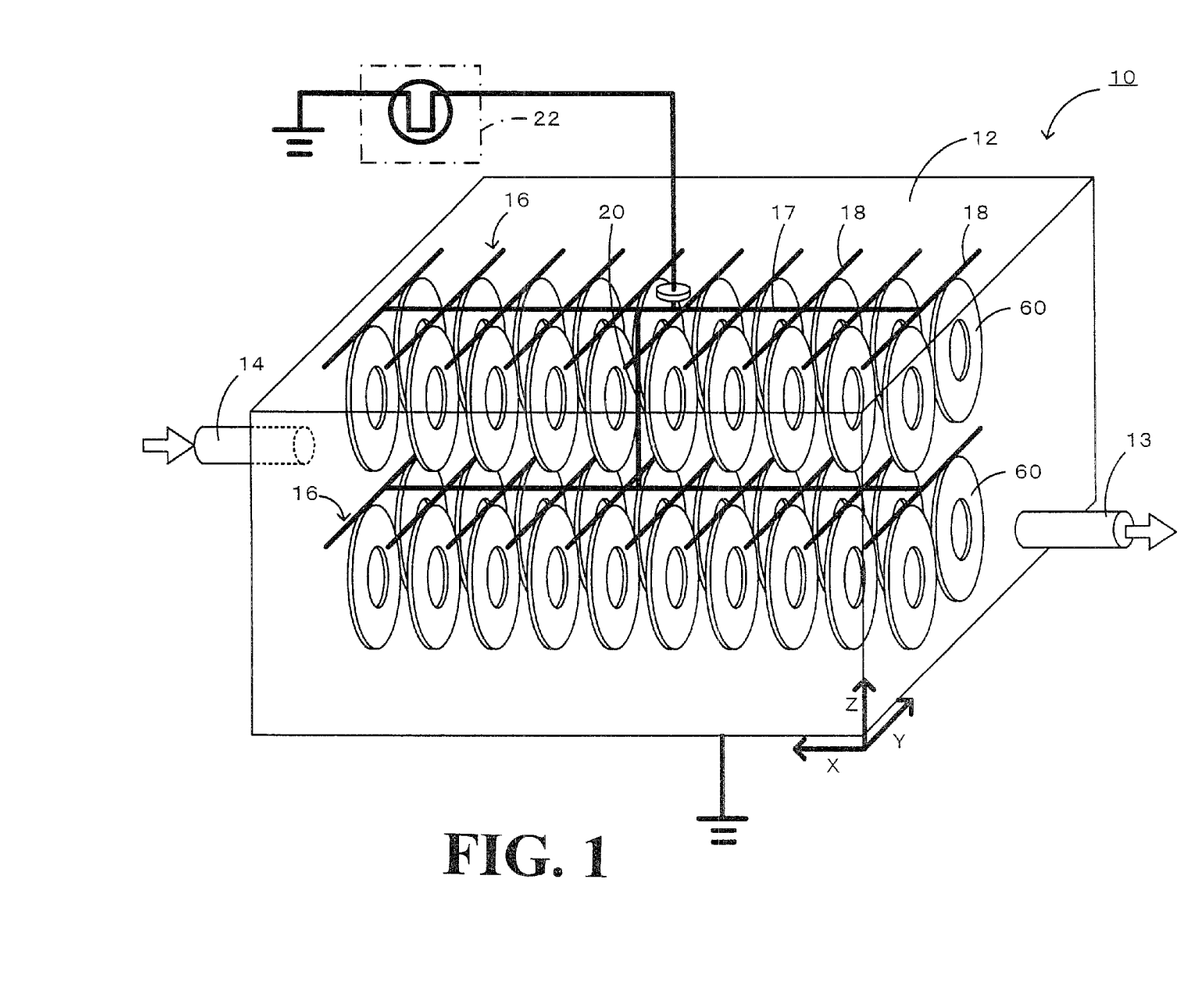
Figure 2:
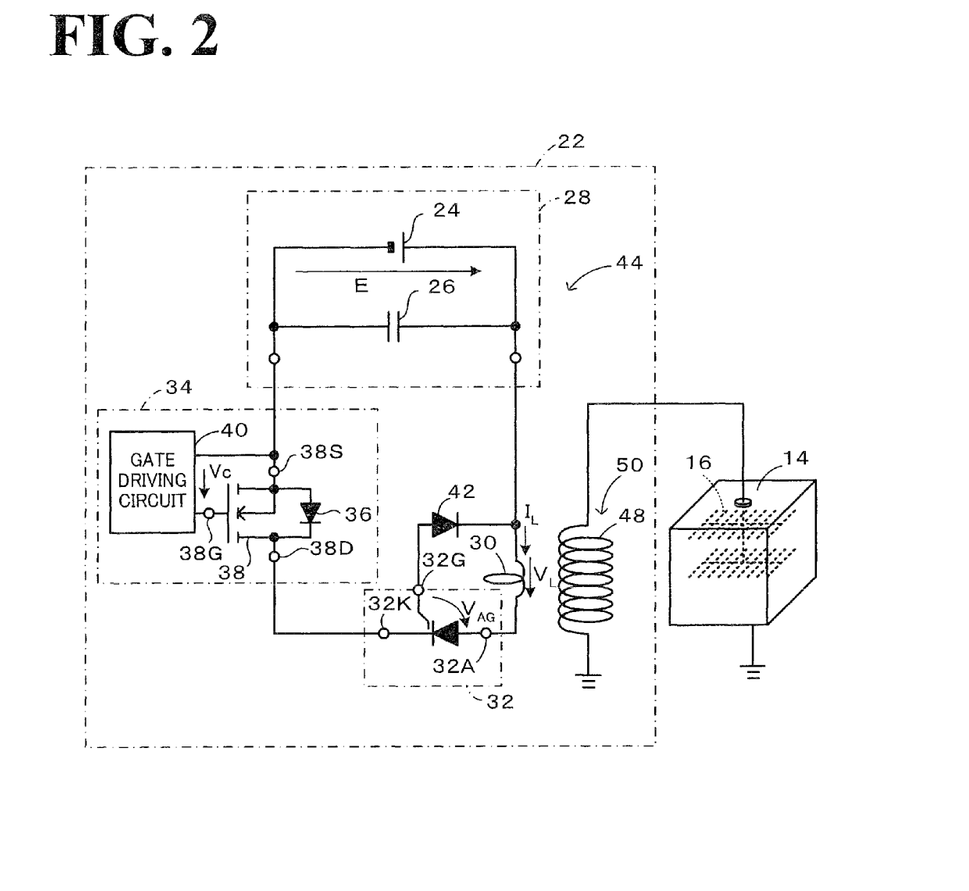
FIG. 2 is a circuit diagram of a DC pulse generator 22.

An embodiment of the present invention will now be described with reference to drawings. FIG. 1 is an explanatory view schematically showing a DLC film mass-producing apparatus 10 and FIG. 2 is an explanatory view of a DC pulse source.

The DLC film mass-producing apparatus 10 produces DLC films on a plurality of plate-shaped substrates 60 made of an iron material (e.g., an SUS material or an SS material). The DLC film mass-producing apparatus 10 includes a chamber 12 made of stainless steel and connected to ground, a supporting beam 16 that supports the plurality of plate-shaped substrates 60 in the chamber 12, and a DC pulse generator 22 that applies a negative DC pulse voltage to the supporting beam 16.

The chamber 12 is formed in a box shape with a board made of stainless steel, and the inside of the chamber 12 is an enclosed space. The chamber 12, which is connected to a vacuum pump (not shown), includes a gas outlet 13 for controlling the internal pressure of the chamber 12 to negative pressure by driving the vacuum pump and a gas inlet 14 from which various gases can be injected into the chamber 12. For convenience of description, the width direction, the depth direction, and the height direction of the chamber 12 are referred to as an X direction, a Y direction, and a Z direction, respectively.

The supporting beam 16 is constituted by a single primary supporting rod 17 made of stainless steel and extending in the X direction and many secondary supporting rods 18 made of stainless steel and extending in the Y direction. Each of the secondary supporting rods 18 is fixed to the primary supporting rod 17 at its middle point so as to be perpendicular to the primary supporting rod 17. In addition, S-shaped hooks (not shown) made of stainless steel are disposed near both ends of each of the secondary supporting rods 18. The secondary supporting rods 18 support the plate-shaped substrates 60 hung through the S-shaped hooks. The supporting beam 16 is disposed in the upper space and the lower space inside the chamber 12. The two supporting beams 16 are electrically connected through a vertical connection rod 20 made of stainless steel. Although the plate-shaped substrates 60 are supported by the supporting beam 16 in this case, they may be supported by other methods. For example, when a substrate to be hung is heavy, an additional supporting rod that extends from the bottom surface of the chamber and is electrically insulated from the chamber may be provided to support the substrate. When the number of substrates to be hung is large, two or more supporting beams 16 connected to the DC pulse generator may be provided in the chamber.

The DC pulse generator is electrically connected to the supporting beam 16 in an insulated manner from the chamber 12. The DC pulse generator 22 includes a primary winding circuit 44 and a secondary winding circuit 50. The primary winding circuit 44 includes an inductor 30, a first semiconductor switch 32, and a second semiconductor switch 34 that are connected in series between both terminals of a DC power supply unit 28. The DC power supply unit 28 includes a DC power supply 24 and a capacitor 26 that lowers a high-frequency impedance. The secondary winding circuit 50 includes a coil element 48 electrically connected to the supporting beam. In the primary winding circuit 44, the inductor 30 has a terminal connected to an anode terminal 32A of the first semiconductor switch 32 and another terminal connected to a gate terminal 32G, which is a control terminal, of the first semiconductor switch 32 through a diode 42. The diode 42 has an anode connected to the gate terminal 32G of the first semiconductor switch 32. A device controlled by current, a self-turn-off device, or a commutation-turn-off device can be used as the first semiconductor switch 32. In this case, a static induction (SI) thyristor is used because it has a significantly large tolerance relative to a voltage build-up rate (dv/dt) when being turned off and also has a high voltage rating. A self-turn-off device or a commutation-turn-off device can be used as the second semiconductor switch 34. In this case, a power metal oxide semiconductor field-effect transistor (power MOSFET) 38 including an avalanche diode 36 in inverse-parallel connection is used. The second semiconductor switch 34 includes the power MOSFET 38 and a gate driving circuit 40 that is connected to a gate terminal 38G and a source terminal 38S of the power MOSFET 38 and that controls ON/OFF of an electric current flow between the source terminal 38S and a drain terminal 38D. The inductor 30 of the primary winding circuit 44 is a primary winding and the coil element 48 of the secondary winding circuit 50 is a secondary winding, both of which function as a transformer. A voltage of VAG×N2/N1 can be applied to both terminals of the coil element 48 in the secondary winding circuit 50, where N1 is the number of turns of the primary winding, N2 is the number of turns of the secondary winding, and VAG is a voltage between the anode and gate of the first semiconductor switch 32. The coil element 48 has one terminal electrically connected to the supporting beam 16 and another terminal electrically connected to the ground.

Figure 3:
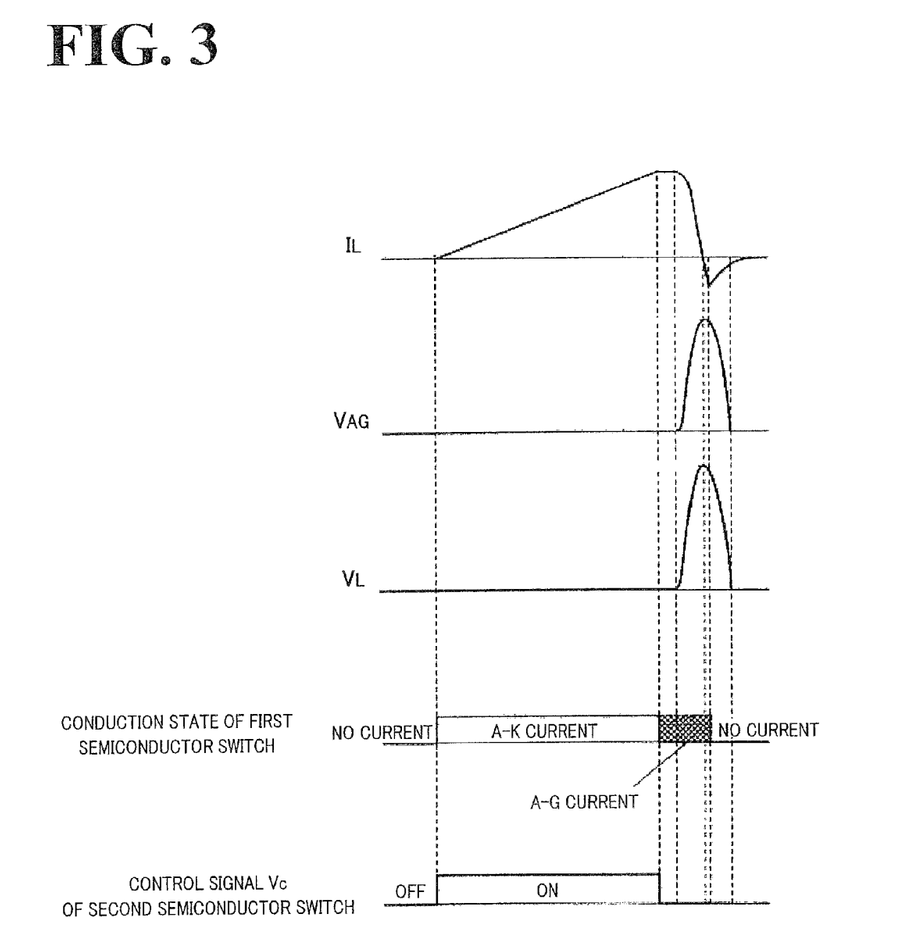
FIG. 3 is an explanatory view showing an operation waveform of current and voltage of each part.

A pulse voltage generation mechanism in the primary winding circuit 44 of the DLC film mass-producing apparatus 10 will be described. When the gate driving circuit 40 supplies a control signal Vc between the gate and source of the power MOSFET 38, the power MOSFET 38 is turned on from an off state. At this point, the first semiconductor switch 32 is turned on by a field effect caused by applying a positive voltage between the gate terminal 32G and cathode terminal 32K thereof due to a significantly large impedance provided in opposite polarity by the diode 42. As a result, a current flows between the anode terminal 32A and the cathode terminal 32K (A-K current). When the first semiconductor switch 32 and the second semiconductor switch 34 are connected to allow current flow, a voltage, which is substantially the same as a voltage E of the DC power supply 24, is applied to the inductor 30, so that a desired amount of energy is stored. After the desired amount of energy is obtained, the gate driving circuit 40 stops supplying the control signal Vc to turn off the power MOSFET 38. At this time, a pulse voltage is generated at the inductor 30. Specifically, when the second semiconductor switch 34 is turned off, the current IL of the inductor 30 is commutated to the path from the anode terminal 32A of the first semiconductor switch 32 to the gate terminal 32G of the first semiconductor switch 32 to the anode of the diode 42 to the cathode of the diode 42, whereby a current flows between the anode terminal 32A and the gate terminal 32G (A-G current). A current due to the energy stored in the inductor 30 keeps flowing from the anode terminal 32A to the gate terminal 32G and the first semiconductor switch 32 shifts to an off state. Consequently, the voltage VAG between the anode and gate of the first semiconductor switch 32 and a voltage VL between the terminals of the inductor 30 sharply increase. When the current IL becomes nil, the voltages VAG and VL reach their peak. After that, when the first semiconductor switch 32 is turned off, the voltages VAG and VL sharply decrease. This is shown in FIG. 3. In FIG. 3, the current IL is a current that flows through the inductor 30, the voltage VAG is a voltage between the anode and gate of the first semiconductor switch 32, and the voltage VL is a voltage between the terminals of the inductor 30. The detailed mechanism of a pulse voltage is described in, for example, Japanese Patent No. 3811681.

A case where the DLC films are produced on the plurality of plate-shaped substrates 60 using the DLC film mass-producing apparatus 10 will now be described. The plate-shaped substrates 60 are hung from the supporting beam 16 disposed in the upper and lower spaces so as to be spaced at certain intervals. The interval between the plate-shaped substrates 60 will be described later. In the DLC film mass-producing apparatus 10, a counter electrode that faces each of the plate-shaped substrates 60 is not particularly disposed. However, since one side of each of eight of the plate-shaped substrates 60 in total hung from both ends of the supporting beam 16 in the X direction faces either of the side walls of the chamber 12, these walls function as a counter electrode. The plate-shaped substrates 60 other than the eight plate-shaped substrates 60 do not face something that functions as a counter electrode. Air is then evacuated using the vacuum pump (not shown) connected to the gas outlet 13 until the internal pressure of the chamber 12 is reduced to 0.01 Pa or less. Subsequently, without heating the substrates, an inert gas (e.g., argon gas, helium gas, nitrogen gas, or hydrogen gas, or a mixture thereof) is injected from the gas inlet 14 until the internal pressure reaches several pascals, and sputtering is conducted by plasma discharge to clean the surface of each of the plate-shaped substrates 60. Though the substrates are heated by the plasma heat and the pulse current in this sputtering process, substrates are prevented from being heated to a high temperature because the pulse half width is short. Subsequently, after a gas containing silicon (for example, tetramethylsilane gas) is injected from the gas inlet 14 at a certain flow rate until the internal pressure reaches several tenths of pascals, an underlying contact layer mainly composed of silicon is formed by plasma discharge. Film formation is then conducted for several hours by injecting a carbon source gas (hydrocarbon gas such as acetylene gas, methane gas, benzene gas, or toluene gas) from the gas inlet 14 such that the internal pressure reaches a desired value between 0.1 to 10 Pa and applying a DC pulse voltage such that its pulse half width becomes a desired value between 0.1 to 3 μsec at negative potential. With this arrangement, sheath width can be sufficiently narrow in plasma generation and DLC films having high hardness and low surface roughness are produced. Thus, DLC films having good characteristics can be produced on a plurality of plate-shaped substrates using a small apparatus.

The interval between the plate-shaped substrates 60 is set to be two or more times larger than the sheath width (thickness) in plasma generation. In plasma generation, a sheath (region with a low electron density) is formed between the surface of each of the plate-shaped substrates 60 and plasma, and ions are drawn out from the plasma surface due to a potential difference applied between both ends of the sheath. As a result, a thin film is uniformly formed on the plate-shaped substrate 60. Therefore, uniform plasma needs to exist between the plate-shaped substrates 60 adjacent to each other. If the sheath formed near the surface of the plate-shaped substrate 60 overlaps with that formed near the surface of the adjacent plate-shaped substrate 60, uniform plasma does not exist between the two plate-shaped substrates 60 and a thin film is not formed. Thus, the interval between the two plate-shaped substrates 60 is necessarily set to be two or more times larger than the sheath width. As described later in Examples with reference to FIG. 5, the sheath width is determined according to pulse half width under plasma generating conditions and internal pressure of the chamber 12. Specifically, it is evident from an experiment that, by using the conditions that the pulse half width is 0.1 to 3 μsec and the internal pressure of the chamber 12 is 0.1 to 10 Pa when a DC pulse voltage is applied, the sheath width can be controlled to 5 mm or more and 40 mm or less and DLC films can be obtained. Accordingly, if plasma generating conditions are set within these ranges, the interval between plate-shaped substrates can be narrowed sufficiently and the plate-shaped substrates can be disposed at a minimum interval of about 10 mm.

In the DLC film mass-producing apparatus 10 of this embodiment described above in detail, DLC films having good characteristics, that is, DLC films having high hardness and low surface roughness Ra can be produced on the plurality of plate-shaped substrates 60 using a small apparatus. With the gas inlet provided on the side surface of the chamber, the structure of the apparatus is simplified. Furthermore, since the DC pulse generator 22 is adopted, a DC pulse voltage that sharply rises can be applied to each of the plate-shaped substrates 60.

Obviously, the present invention is not limited to the embodiment described above and various modifications can be made within the technical scope of the present invention.

For example, although the DC pulse generator 22 is constituted by the primary winding circuit 44 and the secondary winding circuit 50 in the embodiment described above, the coil element 48 may be electrically connected instead of the inductor 30. In this case, the coil element 48 has one terminal connected to the supporting beam 16 that supports each of the plate-shaped substrates 60 and another terminal connected to ground. Thus, a pulse voltage generated in the coil element 48 is directly applied to the supporting beam 16.

In the embodiment described above, an opening circuit in which a pulse voltage is generated when the first and second semiconductor switches 32 and 34 are turned off is adopted as the primary winding circuit 44. However, a closing circuit in which a pulse voltage is generated when such switches are turned on may be adopted.

In the embodiment described above, the substrates are made of an iron material, such as an SUS material or an SS material. The substrates may be made of metal with a resin material provided thereon. With such substrates, DLC films having good characteristics can be produced on the plurality of the substrates

EXAMPLES

Examples 1 to 6 and Comparative Examples 1 to 3

Rings were used as the plate-shaped substrates 60. The rings had an outer diameter φ of 250 mm, an inner diameter φ of 100 mm, and a thickness of 2.0 mm. The rings are made of SKD and had Cr-plating with a thickness of 3 μm on their surfaces. The chamber 12 having a width of 1 m, a depth of 1 m, and a height of 1 m was used.

The film formation was basically conducted as follows. In each of Examples 1 to 6 and Comparative Examples 1 and 2, the plate-shaped substrates 60 were hung from the supporting beam 16 disposed in the upper and lower spaces, on the basis of the disposed number and the substrate interval shown in Table 1. Air was then evacuated using an oil rotary pump and an oil diffusion pump (both not shown) connected to the gas outlet 13 in that order until the internal pressure of the chamber 12 was reduced to 0.01 Pa or less. After argon gas was injected until the internal pressure of the chamber 12 reached 1.0 Pa, the surface of each of the plate-shaped substrates 60 was cleaned for one hour in a sputtering process by plasma discharge generated using the DC pulse generator 22. Subsequently, after tetramethylsilane gas was injected until the internal pressure of the chamber 12 reached 0.3 Pa, an underlying contact layer mainly composed of silicon and having a thickness of 0.1 μm was formed by plasma discharge. The plasma discharge used in the sputtering process and in the forming of underlying contact layer was generated using a DC pulse voltage having a peak pulse voltage of 10 kV and a pulse half width of 1.4 μsec. Film formation was then conducted for three hours by injecting acetylene gas such that the internal pressure of the chamber 12 reached 10.0 Pa and applying a DC pulse voltage having a peak pulse voltage of 4 kV and a pulse half width of 2.5 μsec at negative potential. After that, the plate-shaped substrates 60 on which films had been formed were taken out from the chamber 12, and hardness and elastic modulus were measured using a mechanical property evaluation apparatus (Nano Indenter XP available from MTS Systems Corporation). Table 1 shows the results with a film formation rate.

Figure 4:
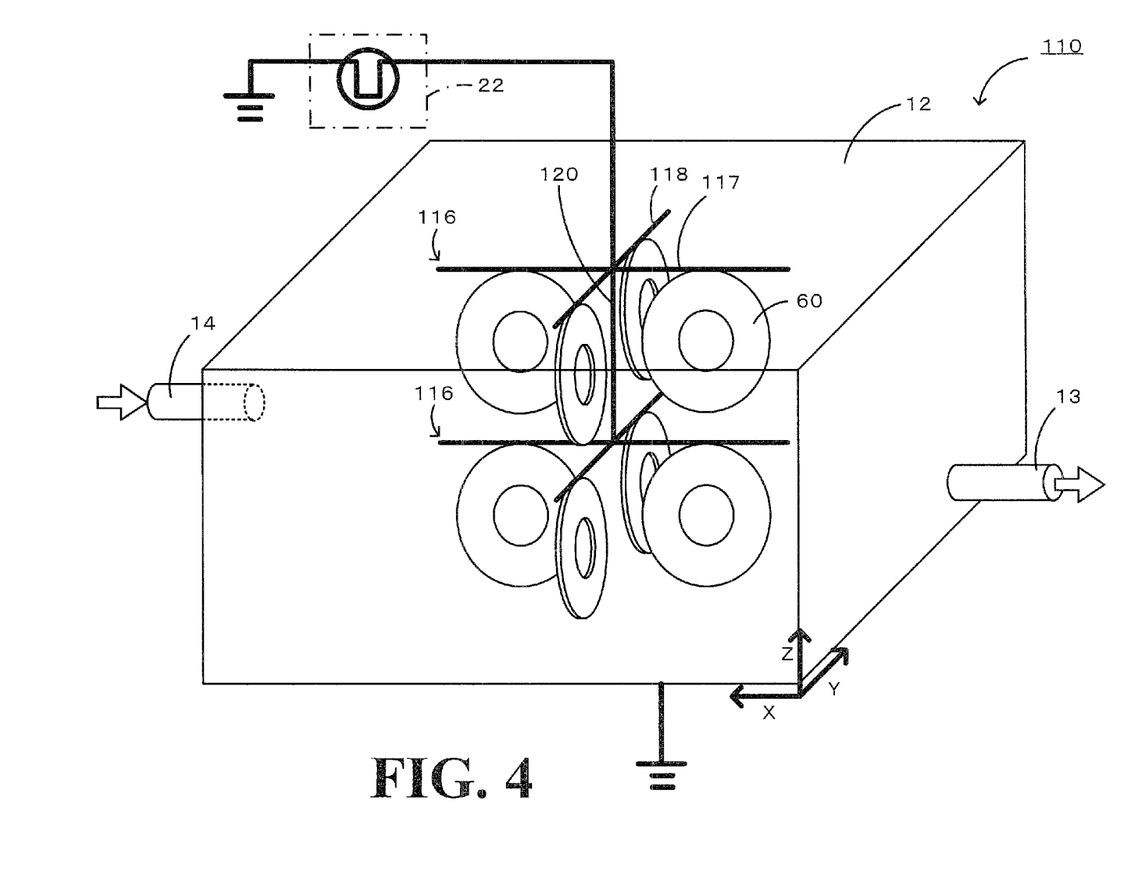
FIG. 4 is an explanatory view schematically showing a DLC film mass-producing apparatus 110 of Comparative Example 3.

In contrast, a DLC film mass-producing apparatus 110 shown in FIG. 4 was used in Comparative Example 3. The DLC film mass-producing apparatus 110 has the same structures as the DLC film mass-producing apparatus 10 except that a supporting beam 116 is used instead of the supporting beam 16. Therefore, only the supporting beam 116 will be described in detail. In the supporting beam 116, a single primary supporting rod 117 made of stainless steel and extending in the X direction was fixed to a single secondary supporting rod 118 made of stainless steel and extending in the Y direction at their middle points, so as to be perpendicular to the secondary supporting rod 118. The supporting beam 116 was disposed in the upper space and the lower space inside the chamber 12. The two supporting beams 116 were electrically connected through a vertical connection rod 120. In Comparative Example 3, two of the plate-shaped substrates 60 were hung from near both ends of the primary supporting rod 117 while other two of the plate-shaped substrates 60 were hung from near both ends of the secondary supporting rod 118. In other words, eight of the plate-shaped substrates 60 in total were disposed as shown in FIG. 4. Since both sides of each of the plate-shaped substrates 60 face the side walls of the chamber 12, these side walls function as a counter electrode. After eight of the plate-shaped substrates 60 were disposed under the supporting beam 116, film formation was conducted in accordance with the basic film formation process described above. The plate-shaped substrates 60 on which films had been formed were taken out from the chamber 12, and hardness and elastic modulus were measured. Table 1 shows the results with a film formation rate.

Example 4 (the internal pressure of the chamber 12 was 0.01 Pa) because discharge did not occur. In comparative Examples 5 and 6 (the internal pressure of the chamber 12 was 13 Pa or more), films were formed, but their surface roughness Ra was 0.5 or more. Since low friction, which is

TABLE 1

|  | NUMBER OF SUBSTRATES | SUBSTRATE INTERVAL (mm) | INTERNAL PRESSURE (Pa) | PULSE HALF WIDTH (μsec) | FILM FORMING RATE (μm/h) | HARDNESS (GPa) | ELASTIC MODULUS (GPa) |
|---|---|---|---|---|---|---|---|
| COMPARATIVE EXAMPLE 1 | 300 | 7 | 10.0 | 2.5 | FORMED PARTIALLY | | |
| COMPARATIVE EXAMPLE 2 | 400 | 5 | 10.0 | 2.5 | FORMED ON PERIPHERY | | |
| EXAMPLE 1 | 8 | 500 | 10.0 | 2.5 | 1.08 | 17.0 | 175 |
| EXAMPLE 2 | 12 | 250 | 10.0 | 2.5 | 1.11 | 17.7 | 179 |
| EXAMPLE 3 | 20 | 100 | 10.0 | 2.5 | 1.15 | 17.9 | 182 |
| EXAMPLE 4 | 40 | 50 | 10.0 | 2.5 | 1.18 | 18.2 | 184 |
| EXAMPLE 5 | 100 | 20 | 10.0 | 2.5 | 1.22 | 18.5 | 187 |
| EXAMPLE 6 | 200 | 10 | 10.0 | 2.5 | 1.24 | 18.7 | 188 |
| COMPARATIVE EXAMPLE 3 | 8 | — | 10.0 | 2.5 | 1.06 | 16.8 | 170 |

As evident from Table 1, DLC films having a hardness of 17.0 GPa or more and an elastic modulus of 175 GPa or more were produced in Examples 1 to 6 (substrate interval: 10 to 500 mm). However, even film formation was not achieved in Comparative Examples 1 and 2 (substrate interval: 7 mm and 5 mm). Under these plasma generating conditions, it was found that the substrate interval could be narrowed to about 10 mm. In both Example 1 in which only one side of each of the plate-shaped substrates 60 has a counter electrode and Comparative Example 3 in which both sides of each of the plate-shaped substrates 60 have corresponding counter electrodes, equivalent DLC films were produced. Accordingly, it was found that counter electrodes corresponding to both sides of each of the plate-shaped substrates 60 were not necessary when DLC films were produced.

Examples 7 to 10 and Comparative Examples 4 to 6

In Examples 7 to 10 and Comparative Examples 4 to 6, film formation was conducted as in Example 4 except that the pulse half width was set to be 1.0 μsec and the internal pressure of the chamber 12 was changed to various values. That is to say, film formation was conducted by changing the internal pressure of the chamber 12 from 0.01 to 20 Pa. Table 2 shows the results.

one of the features of DLC films, was not achieved, it was determined that the resultant films were not DLC films.

[Relationship Between Sheath Width, Internal Pressure of Camber 12, and Pulse Half Width]

Figure 5:
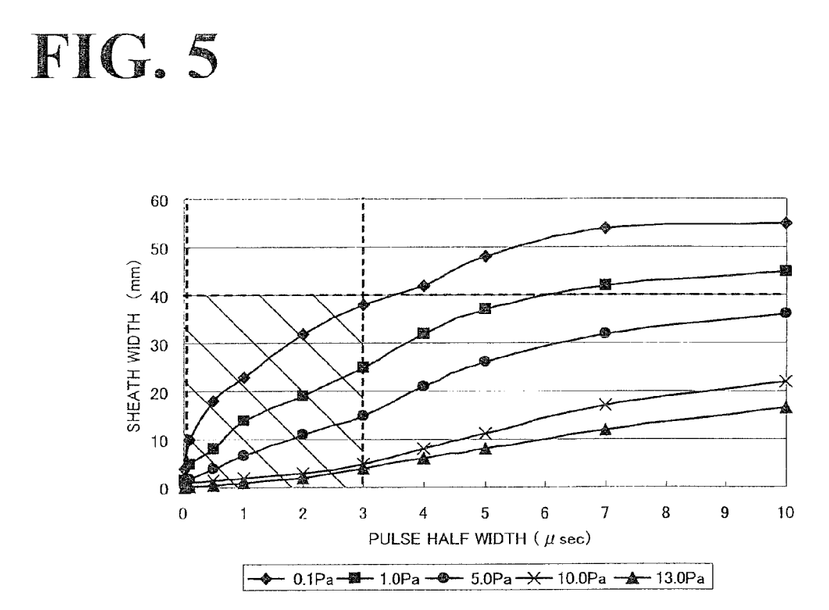
FIG. 5 is a graph showing a relationship between pulse half width, chamber internal pressure, and sheath width.

The relationship between sheath width, the internal pressure of the chamber 12, and the pulse half width of a DC pulse voltage during plasma discharge was examined. With Langmuir probe plasma monitor LPM-100 available from ARIOS INC., the measurement was conducted using argon gas. FIG. 5 shows the results. As evident from FIG. 5, it was revealed that, by using the conditions that the internal pressure of the chamber 12 was 0.1 Pa or more and the pulse half width of the DC pulse voltage was 0.1 to 3 μsec, the sheath width could be controlled to 5 mm or more and 40 mm or less. The substrate interval can be sufficiently narrowed by controlling the sheath width to 5 mm or more and 40 mm or less. However, since the DLC films were not produced when the internal pressure of the chamber 12 was 13 Pa or more as shown in Table 2, the internal pressure of the chamber 12 needs to be set in a range of 0.1 to 10 Pa. In other words, to mass-produce DLC films using the DLC film mass-producing apparatus 10, the internal pressure of the chamber 12 is preferably set in a range of 0.1 to 10 Pa and the pulse half width of a DC pulse voltage is preferably set in a range of 0.1 to 3 μsec in plasma generation.

TABLE 2

|  | NUMBER OF SUBSTRATES | SUBSTRATE INTERVAL (mm) | INTERNAL PRESSURE (Pa) | PULSE HALF WIDTH (μsec) | HARDNESS (GPa) | ELASTIC MODULUS (GPa) | SURFACE ROUGHNESS Ra(nm) | FILM STATE |
|---|---|---|---|---|---|---|---|---|
| COMPARATIVE EXAMPLE 4 | 40 | 50 | 0.01 | 1.0 | NOT FORMED DUE TO NON-DISCHARGE | | | |
| EXAMPLE 7 | 40 | 50 | 0.1 | 1.0 | 16.7 | 171 | <0.1 | DLC |
| EXAMPLE 8 | 40 | 50 | 1.0 | 1.0 | 16.1 | 165 | <0.1 | DLC |
| EXAMPLE 9 | 40 | 50 | 5.0 | 1.0 | 15.5 | 160 | <0.1 | DLC |
| EXAMPLE 10 | 40 | 50 | 10.0 | 1.0 | 14.0 | 135 | <0.1 | DLC |
| COMPARATIVE EXAMPLE 5 | 40 | 50 | 13.0 | 1.0 | 12.0 | 117 | 0.5 | NOT DLC |
| COMPARATIVE EXAMPLE 6 | 40 | 50 | 20.0 | 1.0 | 8.4 | 86 | 1.3 | NOT DLC |

As clear from Table 2, DLC films having a hardness of 14.0 GPa or more, an elastic modulus of 135 GPa or more, and a surface roughness Ra of less than 0.1 nm were produced in Examples 7 to 10. A surface roughness Ra of less than 0.1 nm means that such a film has sufficiently low friction. In contrast, film formation was not achieved in Comparative Examples 11 to 18 and Comparative Examples 7 to 10

Metal disks were used as the plate-shaped substrates 60. The metal disks had an outer diameter ϕ of 250 mm, and a thickness of 2.0 mm. Each of the disks was made of SUS304 and had polycarbonate resin plate or vinyl chloride resin plate having a size of 100 mm in height, 100 mm in width, and 2 mm in thickness, on the both surfaces. The chamber 12 having a width of 1 m, a depth of 1 m, and a height of 1 m was used. Film formation and evaluation of formed films were conducted as in Examples 1 to 6. For evaluation of films formed on the polycarbonate resin plate or the vinyl chloride resin plate, adhesion of the films were evaluated by a scratch test using HEIDON: TYPE-32 (manufactured by Shinto Scientific Co., Ltd.). In the scratch test, a diamond indenter having the end with diameter of 50 μm was used as a scratcher and the load was set to 10 mgf. It is difficult to measure hardness of a hard film on a soft substrate, therefore, determination whether a film is a DLC film having good properties was conducted based on results of evaluation of adhesion and visual judgment. Table 3 shows the results of evaluation of the films formed using the polycarbonate resin plate, and Table 4 shows the results of evaluation of the films formed using the vinyl chloride resin plate. It is clear from the results shown in Tables 3 and 4 that the inter pressure of the chamber 12 needs to be set in a range of 0.1 to 10.0 Pa.

TABLE 3

|  | NUMBER OF SUBSTRATES | SUBSTRATE INTERVAL (mm) | INTERNAL PRESSURE (Pa) | PULSE HALF WIDTH (μsec) | ADHESION | FILM STATE |
|---|---|---|---|---|---|---|
| COMPARATIVE EXAMPLE 7 | 40 | 50 | 0.01 | 1.0 |  | NOT FORMED DUE TO NON-DISCHARGE |
| EXAMPLE 11 | 40 | 50 | 0.1 | 1.0 | OK | DLC |
| EXAMPLE 12 | 40 | 50 | 1.0 | 1.0 | OK | DLC |
| EXAMPLE 13 | 40 | 50 | 5.0 | 1.0 | OK | DLC |
| EXAMPLE 14 | 40 | 50 | 10.0 | 1.0 | OK | DLC |
| COMPARATIVE EXAMPLE 8 | 40 | 50 | 13.0 | 1.0 | NG | NOT DLC |

TABLE 4

|  | NUMBER OF SUBSTRATES | SUBSTRATE INTERVAL (mm) | INTERNAL PRESSURE (Pa) | PULSE HALF WIDTH (μsec) | ADHESION | FILM STATE |
|---|---|---|---|---|---|---|
| COMPARATIVE EXAMPLE 9 | 100 | 20 | 0.01 | 2.0 |  | NOT FORMED DUE TO NON-DISCHARGE |
| EXAMPLE 15 | 100 | 20 | 0.1 | 2.0 | OK | DLC |
| EXAMPLE 16 | 100 | 20 | 1.0 | 2.0 | OK | DLC |
| EXAMPLE 17 | 100 | 20 | 5.0 | 2.0 | OK | DLC |
| EXAMPLE 18 | 100 | 20 | 10.0 | 2.0 | OK | DLC |
| COMPARATIVE EXAMPLE 10 | 100 | 20 | 13.0 | 2.0 | NG | NOT DLC |

The present application claims priorities from the Japanese Patent Application No. 2008-091400 filed on Mar. 31, 2008, and the Japanese Patent Application No. 2009-057109 filed on Mar. 10, 2009, entire contents of both of which are incorporated by reference herein.

What is claimed is:

1. A direct current (DC) diamond-like carbon (DLC) film mass-producing method for mass-producing DLC films on a plurality of plate-shaped substrates, comprising the steps of:
   (a) disposing the plurality of plate-shaped substrates in parallel at regular intervals, wherein the plurality of plate-shaped substrates are electrically connected and are provided without disposing a counter electrode that faces each of the plate-shaped substrates in a chamber connected to ground; and
   (b) injecting a carbon source gas into the chamber such that an internal pressure of the chamber reaches 0.1 to 10 Pa and simultaneously applying only a negative DC pulse voltage to each of the plate-shaped substrates to generate plasma, the negative DC pulse voltage having a pulse half width of 0.1 to 3 μsec so as to produce a DLC film on each of the plate-shaped substrates having a hardness of 14 GPa or more.

2. The DLC film mass-producing method according to claim 1,
   wherein, in the step (b), the internal pressure of the chamber is set in a range of 0.1 to 10 Pa while the pulse half width is set in a range of 0.1 to 3 μsec so that a sheath width determined according to the internal pressure of the chamber and the pulse half width is controlled to 5 mm or more and 40 mm or less.

3. The DLC film mass-producing method according to claim 1,
   wherein, in the step (b), the interval between the plate-shaped substrates adjacent to each other is set to be more than twice a sheath width determined according to the internal pressure of the chamber and the pulse half width.

4. The DLC film mass-producing method according to claim 1,
   wherein, in the step (b), a calibration curve that describes a relationship between sheath width, the internal pressure of the chamber, and the pulse half width is prepared in advance; and the internal pressure of the chamber and the pulse half width are set according to the calibration curve so that a desired sheath width is achieved.

5. The DLC film mass-producing method according to claim 1,
   wherein the plate-shaped substrates are made of stainless steel, rolled steel, die steel, or high-speed steel.

6. The DLC film mass-producing method according to claim 1,
   wherein the plate-shaped substrates are made of metal with a resin material provided thereon.

7. The DLC film mass-producing method according to claim 1, wherein each surface of the plate-shaped substrates is coated with a wear-resistant layer.

8. The DLC film mass-producing method according to claim 1,
wherein the plate-shaped substrates are components used for extrusion molding, injection molding, or dry molding of ceramic.

9. The DLC film mass-producing method according to claim 1, wherein, in the step (b), a device having an inductor, a first semiconductor switch, and a second semiconductor switch that are connected in series between both terminals of a DC power supply unit is used as a generator of the DC pulse voltage, the inductor having a terminal connected to an anode terminal of the first semiconductor switch and another terminal connected to a gate terminal of the first semiconductor switch through a diode, the diode having an anode terminal connected to the gate terminal of the first semiconductor switch; inductive energy is stored in the inductor with an electrical connection of the first semiconductor switch that occurs when the second semiconductor switch is turned on; and a pulse voltage is generated in the inductor with a turn-off of the first semiconductor switch that occurs when the second semiconductor switch is turned off, and the pulse voltage is raised and supplied to a coil element magnetically connected to the inductor.

* * * * *